United States Patent
Tsai et al.

(10) Patent No.: US 10,431,154 B2
(45) Date of Patent: Oct. 1, 2019

(54) LIGHT-EMITTING DIODE DISPLAY WITH REDUCED LEAKAGE

(71) Applicant: Apple Inc., Cupertino, CA (US)

(72) Inventors: Tsung-Ting Tsai, Santa Clara, CA (US); Shinya Ono, Cupertino, CA (US); Chin-Wei Lin, Cupertino, CA (US); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 279 days.

(21) Appl. No.: 15/431,337

(22) Filed: Feb. 13, 2017

(65) Prior Publication Data

US 2017/0365214 A1    Dec. 21, 2017

Related U.S. Application Data

(63) Continuation-in-part of application No. 15/246,345, filed on Aug. 24, 2016, now Pat. No. 10,311,782.

(60) Provisional application No. 62/350,650, filed on Jun. 15, 2016.

(51) Int. Cl.
*G09G 3/3233* (2016.01)
*G09G 3/3266* (2016.01)
*H01L 27/32* (2006.01)

(52) U.S. Cl.
CPC ......... *G09G 3/3233* (2013.01); *G09G 3/3266* (2013.01); *G09G 2300/0819* (2013.01); *G09G 2300/0842* (2013.01); *G09G 2300/0861* (2013.01); *G09G 2310/08* (2013.01); *G09G 2320/041* (2013.01); *G09G 2320/045* (2013.01); *H01L 27/3279* (2013.01)

(58) Field of Classification Search
CPC ............... G09G 3/3233; G09G 3/3266; G09G 2320/045; G09G 2300/0819; G09G 2300/0861; G09G 2310/08; G09G 2300/0842; G09G 2320/041; H01L 27/3279
See application file for complete search history.

(56) References Cited

U.S. PATENT DOCUMENTS

| | | | |
|---|---|---|---|
| 8,217,868 B2 | 7/2012 | Shin et al. | |
| 8,817,008 B2 | 8/2014 | Park et al. | |
| 8,836,615 B2 | 9/2014 | Schemmann et al. | |
| 9,013,375 B2 | 4/2015 | Yoo | |
| 9,135,859 B2 | 9/2015 | Lee et al. | |

*Primary Examiner* — Aneeta Yodichkas
(74) *Attorney, Agent, or Firm* — Treyz Law Group, P.C.; Joseph F. Guihan; Tianyi He

(57) ABSTRACT

An organic light-emitting diode display may contain an array of display pixels. Each display pixel may have a respective organic light-emitting diode that is controlled by a drive transistor. At low temperatures, it may be necessary to increase the amount of current through an organic light-emitting diode to achieve a desired luminance level. In order to increase the current through the light-emitting diode, the ground voltage level may be lowered. However, this may lead to thin-film transistors within the pixel leaking, which may result in undesirable display artifacts such as bright dots being displayed in a dark image. In order to prevent leakage in the transistors, the transistors may be coupled to separate reference voltage supplies or separate control lines. Additionally, the transistors may be positioned to minimize leakage even at low ground voltage levels.

20 Claims, 13 Drawing Sheets

LIGHT-EMITTING DIODE DISPLAY WITH REDUCED LEAKAGE

This application is a continuation-in-part of patent application Ser. No. 15/246,345, filed Aug. 24, 2016, which is hereby incorporated by reference herein in its entirety and which claims the benefit of provisional patent application No. 62/350,650, filed Jun. 15, 2016, which is hereby incorporated by reference herein in its entirety.

BACKGROUND

This relates generally to displays, and, more particularly, to displays with pixels formed from light-emitting diodes.

Electronic devices often include displays. For example, cellular telephones and portable computers include displays for presenting information to users.

Displays such as organic light-emitting diode displays have arrays of pixels based on light-emitting diodes. In this type of display, each pixel includes a light-emitting diode and thin-film transistors for controlling application of a signal to the light-emitting diode to produce light. The thin-film transistors include drive transistors, switching transistors, and emission enabled transistors. Each drive transistor is coupled in series with a respective light-emitting diode and controls current flow through that light-emitting diode.

In certain circumstances, the thin-film transistors may experience undesirable current leakage. In particular, at low temperatures it may be necessary to increase the amount of current through the light-emitting diode to achieve a desired luminance level which may result in current leakage in the transistors.

It would therefore be desirable to be able to provide a display with improved pixels with minimized thin-film transistor leakage.

SUMMARY

A display may have an array of pixels. Display driver circuitry may supply data and control signals to the pixels. Each pixel may have seven transistors, a capacitor, and a light-emitting diode such as an organic light-emitting diode.

The seven transistors of each pixel may receive control signals over three or more control lines, may receive data over a data line, may receive one or more reference voltages from respective reference voltage terminals, and may receive power from a pair of power supply terminals. The transistors may be positioned to minimize leakage. In particular, the pixels may have reduced leakage in the event that a ground voltage is lowered to account for low temperature conditions.

DETAILED DESCRIPTION

Figure 1:
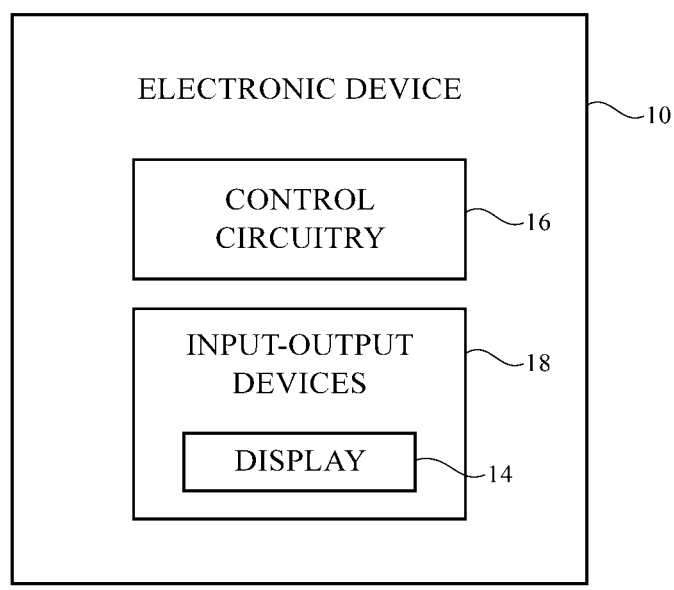
FIG. 1 is a schematic diagram of an illustrative electronic device having a display in accordance with an embodiment.

Electronic devices may be provided with displays. A schematic diagram of an illustrative electronic device with a display is shown in FIG. 1. Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired.

Input-output devices 18 may also include a temperature sensor. During operation of displays such as organic light-emitting diode display 14, temperature changes can lead to changes in the properties of the display pixels. These changes can cause undesired artifacts if not corrected. For example, as a result of the increased current required to operate light-emitting diodes at low temperatures, transistor leakage may occur. To address these issues, a temperature sensor may be included in the electronic device. The temperature sensor may be used to estimate the temperature of the display in real time.

Figure 2:
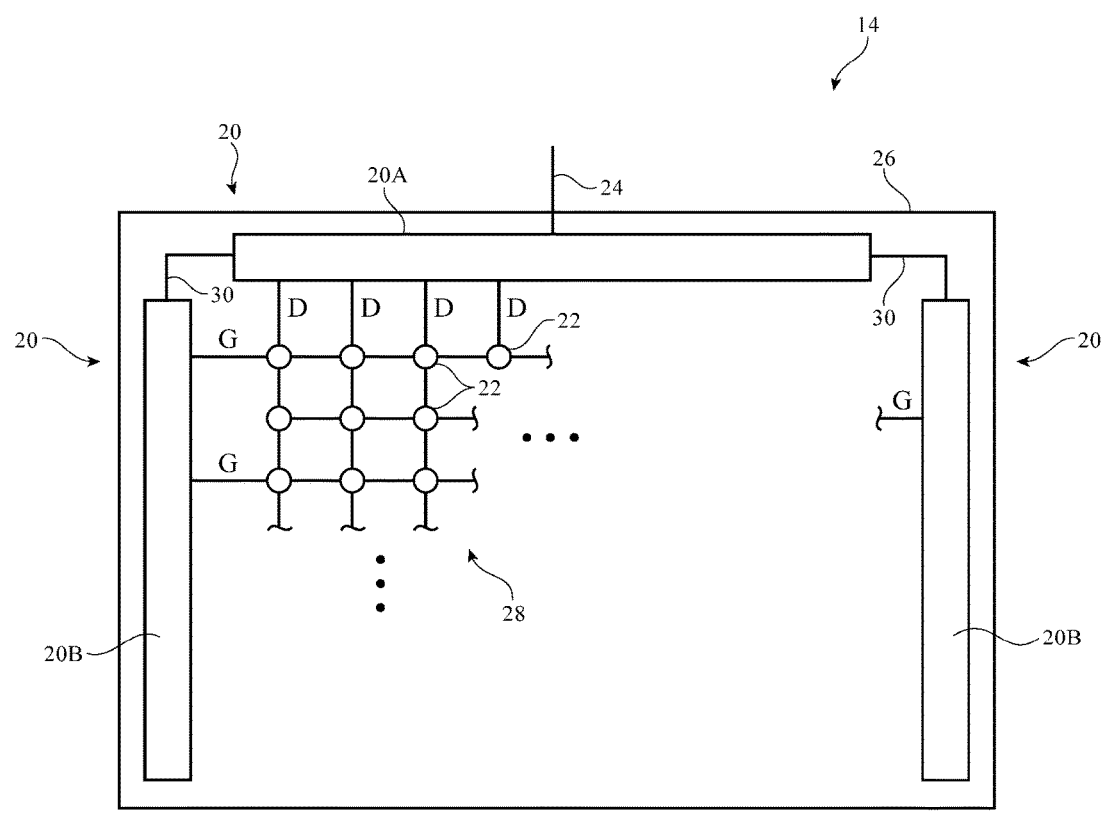
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
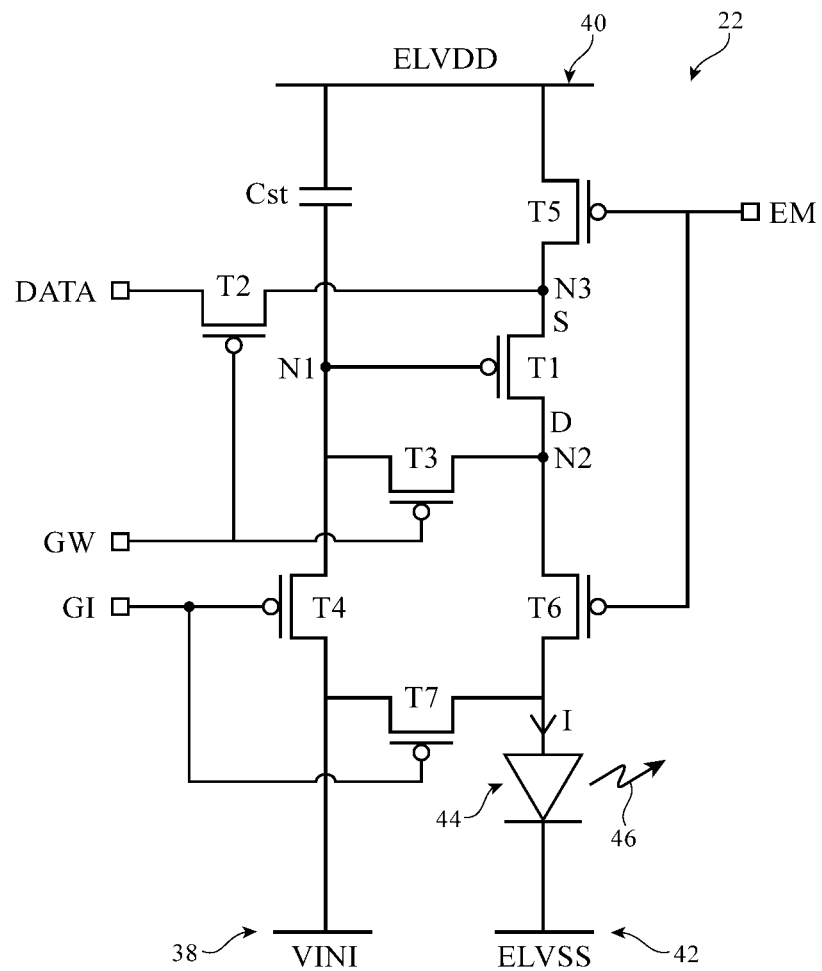
FIG. 3 is a diagram of an illustrative pixel circuit in accordance with an embodiment.

An illustrative pixel circuit of the type that may be used for each pixel 22 in array 28 is shown in FIG. 3. In the example of FIG. 3, pixel circuit 22 has seven transistors T1, T2, T3, T4, T5, T6, and T7 and one capacitor Cst, so pixel circuit 22 may sometimes be referred to as a 7T1C pixel circuit. Other numbers of transistors and capacitors may be used in pixels 22 if desired. The transistors may be p-channel transistors (as shown in FIG. 3) and/or may be n-channel transistors or other types of transistors. The active regions of thin-film transistors for pixel circuit 22 and other portions of display 14 may be formed from silicon (e.g., polysilicon channel regions), semiconducting oxides (e.g., indium gallium zinc oxide channel regions), or other suitable semiconductor thin-film layers.

As shown in FIG. 3, pixel circuit 22 includes light-emitting diode 44 (e.g., an organic light-emitting diode, a crystalline micro-light-emitting diode die, etc.). Light-emitting diode 44 may emit light 46 in proportion to the amount of current I that is driven through light-emitting diode 44 by transistor T1. Transistor T5, Transistor T1, Transistor T6, and light-emitting diode 44 may be coupled in series between respective power supply terminals (see, e.g., positive power supply terminal 40 (ELVDD) and ground power supply terminal 42 (ELVSS). Transistor T1 may have a source terminal (S) coupled to positive power supply terminal 40, a drain terminal (D) coupled to node N2, and a gate terminal coupled to node N1. The terms "source" and "drain" terminals of a transistor can sometimes be used interchangeably and may therefore be referred to herein as "source-drain" terminals. The voltage on node N1 at the gate of transistor T1 controls the amount of current I that is produced by transistor T1. This current is driven through light-emitting diode 44, so transistor T1 may sometimes be referred to as a drive transistor.

Transistors T5 and T6 can be turned off to interrupt current flow between transistor T1 and diode 44 and may be turned on to enable current flow between transistor T1 and diode 44. Emission enable control signal EM is applied to the gates of transistors T5 and T6. During operation, transistors T5 and T6 are controlled by emission enable control signal EM and are sometimes referred to as emission transistors or emission enable transistors. Control signals GW and GI, which may sometimes be referred to as switching transistor control signals, are applied to the gates of switching transistors T2, T3, T4, and T7 and control the operation of transistors T2, T3, T4, and T7. In particular, control signal GW is used to control transistors T2 and T3, while control signal GI is used to control transistors T4 and T7. The capacitor Cst of pixel circuit 22 may be used for data storage. Pixel 22 may also include reference voltage terminal 38 (VINI). Reference voltage terminal 38 may be used to supply a reference voltage (e.g., VINI may be approximately −3.4 Volts or any other desired voltage).

Operation of pixel 22 may be generally have two primary phases: a data writing phase and an emission phase. During the data writing phase, data may be loaded from data lines D (labeled as DATA in FIG. 3) to node N1. The data may be a data voltage that is loaded to Node 1 by turning on transistors T2, T1, and T3. After the data voltage has been loaded into pixel 22, display driver circuitry 20 places pixel 22 in its emission state. During the emission state, the value of the data voltage on node N1 controls the state of drive transistor T1 and thereby controls the amount of light 46 emitted by light-emitting diode 44.

It should be noted that manufacturing variations and variations in operating conditions can cause the threshold voltages of drive transistor T1 to vary. This may cause pixel brightness fluctuations which may give rise to undesired visible artifacts on a display. To help reduce visible artifacts, display 14 may employ any desired threshold voltage compensation techniques to compensate for threshold voltage variation in drive transistor T1.

At low temperatures, it may be necessary to increase the amount of current through the light-emitting diode to achieve a desired luminance level. To compensate for this effect, the voltage of ground power supply terminal 42 (ELVSS) may be adjusted based on temperature. For example, at room temperature, ELVSS may be approximately −5.0 Volts. If the temperature drops to freezing (32° F., 0° C.), however, ELVSS may be dropped to approximately −8.0 Volts. As a consequence for the reduction of ELVSS, some of the transistors in pixel 22 (e.g., T3 and T7) may experience a higher voltage drop across the transistors and be more susceptible to leakage. The leakage may cause light-emitting diode 44 to emit undesirably high levels of light. Additional undesirable leakage may occur due to the voltage drop across transistor T4. The aforementioned examples of ELVSS voltage levels were merely illustrative, and any ELVSS voltage level may be used at any desired temperature.

Figure 4:
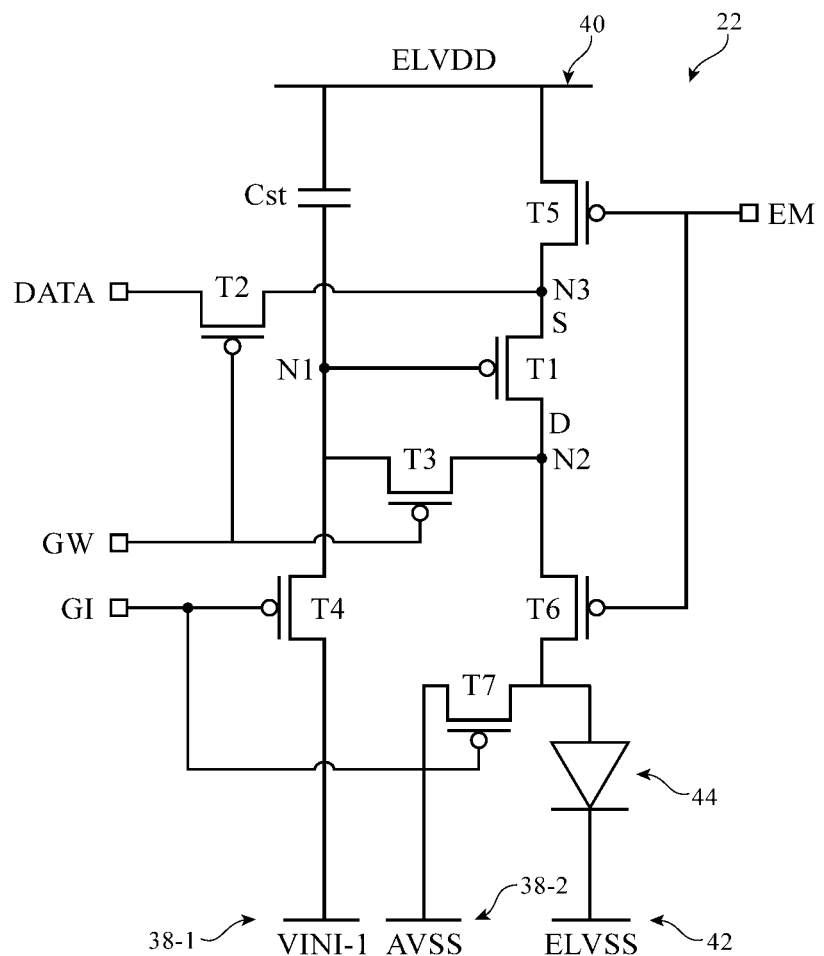
FIG. 4 is a diagram of an illustrative pixel circuit with reduced T4 and T7 leakage in accordance with an embodiment.

There are a number of ways to reduce leakage in pixel 22 and avoid undesired artifacts. FIG. 4 shows an illustrative pixel circuit with reduced leakage for transistors T4 and T7. In FIG. 3, transistor T4 has a first source-drain terminal coupled to N1, a second source-drain terminal coupled to VINI, and a gate terminal coupled to GI, whereas in FIG. 4, transistor T4 has a first source-drain terminal coupled to N1, a second source-drain terminal coupled to VINI-1, and a gate terminal coupled to GI. Similarly, In FIG. 3, transistor T7 has a first source-drain terminal coupled to light-emitting diode 44, a second source-drain terminal coupled to VINI, and a gate terminal coupled to GI, whereas in FIG. 4, transistor T7 has a first source-drain terminal coupled to light-emitting diode 44, a second source-drain terminal coupled to AVSS, and a gate terminal coupled to GI. Importantly, in FIGS. 3, T4 and T7 are both coupled to the same reference voltage VINI, while in FIGS. 4, T4 and T7 are coupled to different reference voltages VINI-1 and AVSS. Using two reference voltage terminals 38-1 and 38-2 allows for independent control of leakage through transistors T4 and T7 which reduces leakage in the transistors.

Figure 5:
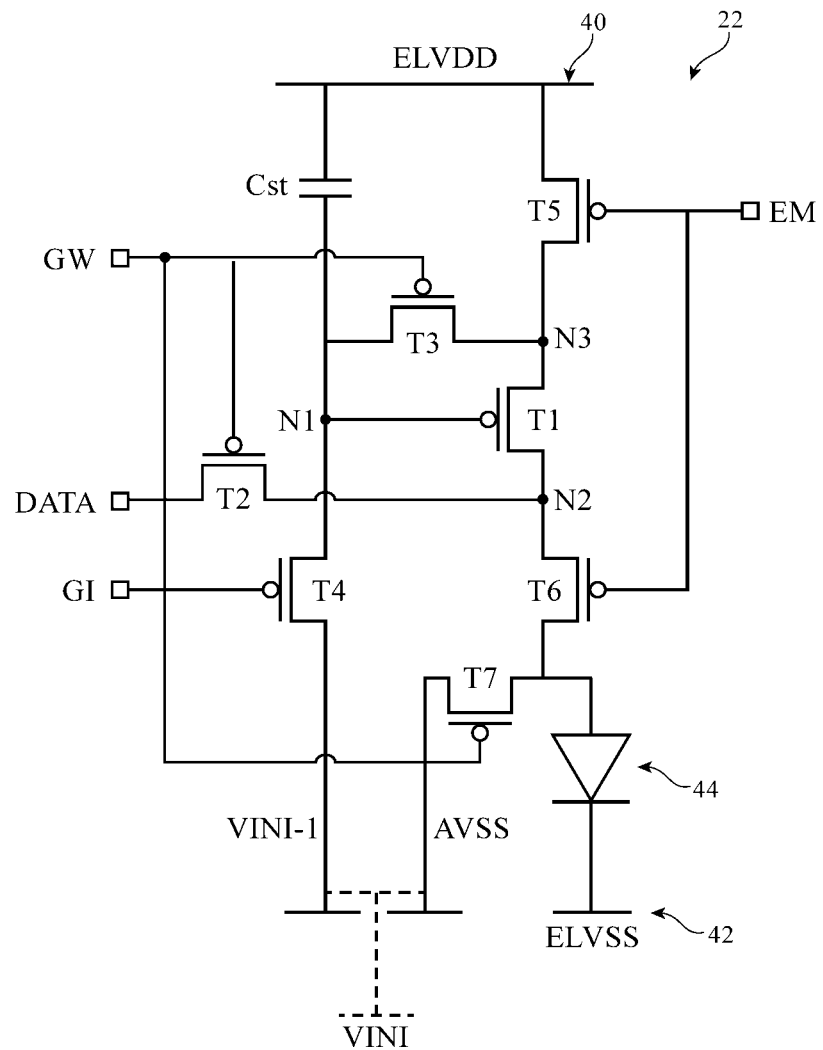
FIG. 5 is a diagram of an illustrative pixel circuit with reduced T3, T4, and T7 leakage in accordance with an embodiment.

Another pixel circuit for reduced leakage is shown in FIG. 5. The structure of pixel 22 in FIG. 5 enables reduced leakage for transistors T3, T4, and T7. In particular, in FIGS. 3, 4, and 5, T3 has a first source-drain terminal coupled to node N1 and a gate terminal coupled to GW. However, in FIGS. 3 and 4, T3 has a second source-drain terminal coupled to node N2 (between T1 and T6), while in FIG. 5 T3 has a second source-drain terminal coupled to N3 (between T1 and T5). Similarly, in FIGS. 3, 4, and 5, T2 has a first source-drain terminal coupled to DATA and a gate terminal coupled to GW. However, in FIGS. 3 and 4, T2 has a second source-drain terminal coupled to node N3 (between T1 and T5), while in FIG. 5 T2 has a second source-drain terminal coupled to N2 (between T1 and T6). Positioning T3 in this manner eliminates the T3 leakage experienced in FIGS. 3 and 4 without affecting the data voltage writing.

FIG. 5 shows T4 coupled to VINI-1 and T7 coupled to AVSS. As discussed in connection with FIG. 4, this may reduce leakage in transistors T4 and T7. However, this example is merely illustrative, and T4 and T7 may optionally be both connected to a single reference voltage terminal VINI, as shown in FIG. 3, while still using the T3 position showed in FIG. 5.

Figure 6:
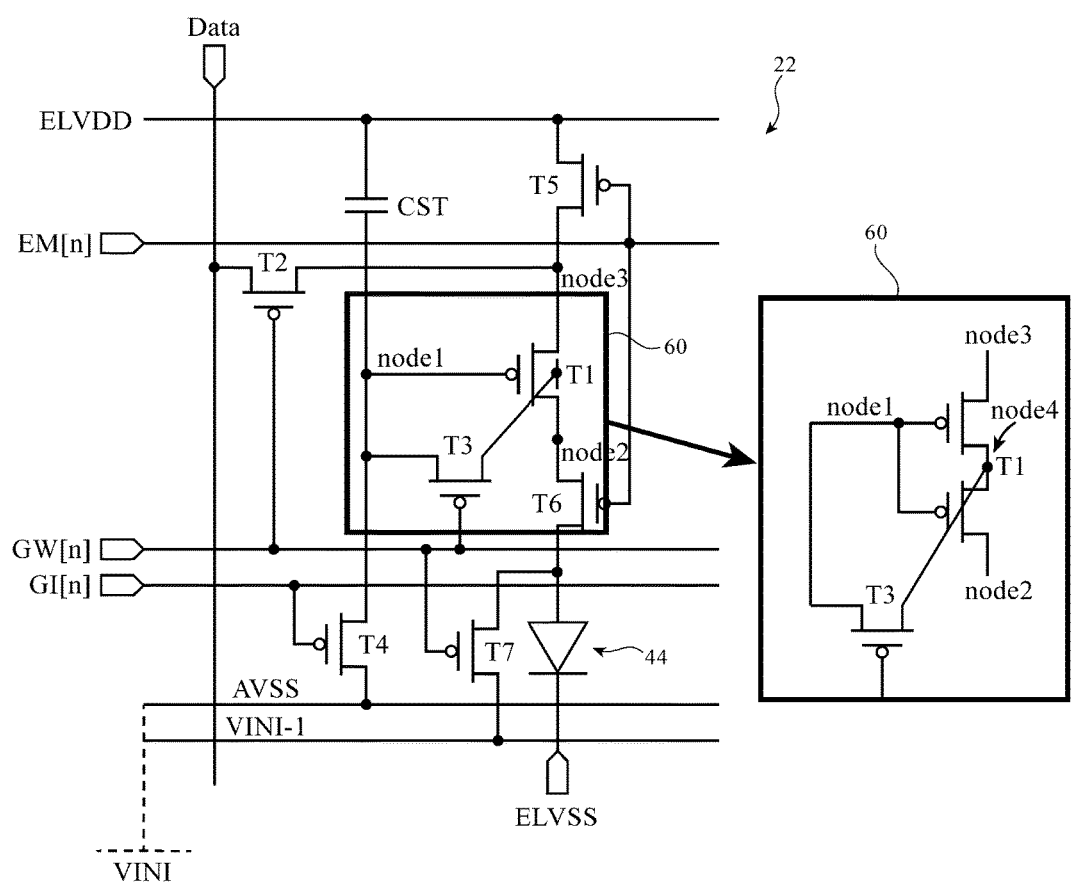
FIG. 6 is a diagram of an illustrative pixel circuit with reduced T3, T4, and T7 leakage in accordance with an embodiment.

FIG. 6 shows another pixel circuit with reduced leakage for transistors T3, T4, and T7. In FIGS. 3, 4, and 6, T3 has a first source-drain terminal coupled to N1, and a gate terminal coupled to GW. However, in FIGS. 3 and 4, T3 has a second source-drain terminal coupled to N2, while in FIG. 6, T3 has a second source-drain terminal coupled to T1, which has a split structure. An enlarged version of region 60 (showing the relationship between T1 and T3) is included in FIG. 6. As shown, T1 is split such that there is a first gate terminal for a first transistor portion and a second gate terminal for a second transistor portion. Both of the gate terminals are coupled to node 1. T1 has an additional terminal (node 4) halfway between T1 (i.e., node 4 is interposed between the first transistor portion and the second transistor portion). Because T1 is split into a dual gate transistor structure, the voltage drop across the source and drain of each transistor portion is (approximately) half as much as if a single gate transistor structure was used. Thus, by coupling the second source-drain terminal of T3 in between the two transistor portions of T1 at node 4, the voltage drop of T3 is lessened and leakage of T3 is reduced.

An additional benefit of the pixel circuit shown in T3 is that the reduced leakage of T3 may enable T3 to be implemented as a single gate thin-film transistor (whereas in FIG. 3, T3 may be implemented as a dual gate thin-film transistor). The space saved by making T3 a single gate thin-film transistor may be used to increase the area of the storage capacitor $C_{ST}$. Yet another advantage of the structure shown in FIG. 6 is that faster threshold voltage sampling may be achieved due to a smaller effective T1 length. As previously mentioned, T1 may undergo threshold voltage compensation to ensure adequate display performance. Part of the threshold voltage compensation process may include sampling the threshold voltage of T1. In FIG. 6, the channel length of T1 may be shorter than the channel length of T1 in FIG. 3, enabling faster threshold voltage sampling in the pixel circuit of FIG. 6 when compared to pixel circuit of FIG. 3.

FIG. 6 shows T4 coupled to VINI-1 and T7 coupled to AVSS. As discussed in connection with FIG. 4, this may reduce leakage in transistors T4 and T7. However, this example is merely illustrative, and T4 and T7 may optionally be both connected to a single reference voltage terminal VINI, as shown in FIG. 3, while still using the T3 position showed in FIG. 6.

Figure 7:
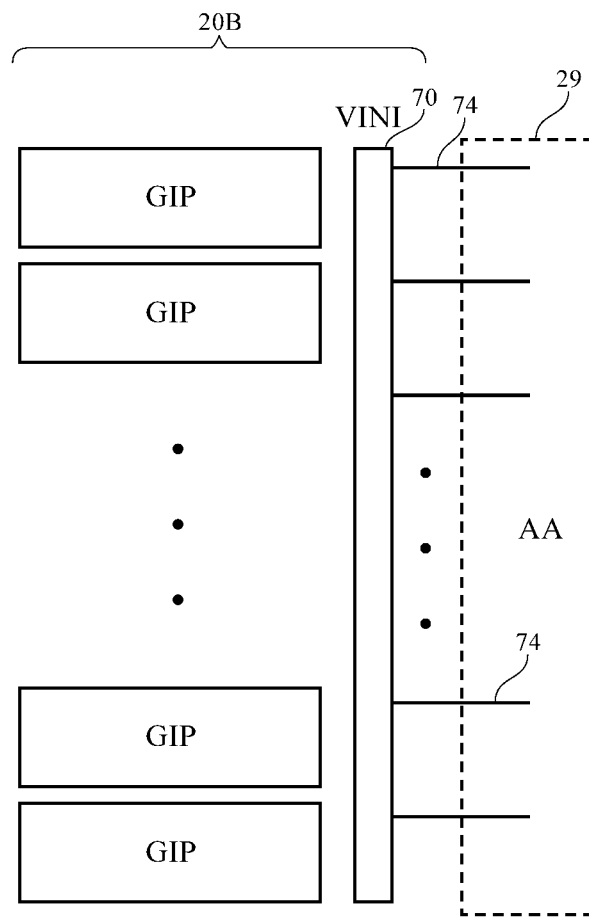
FIG. 7 is a schematic diagram of illustrative gate driver circuitry for a display with a single reference voltage line in accordance with an embodiment.

There are a number of other ways to reduce transistor leakage in the display pixels. As discussed in connection with FIG. 4, one way to reduce leakage for transistors T4 and T7 is to include separate reference voltage terminals 38-1 and 38-2. However, another way to reduce leakage for transistors T4 and T7 is to adjust the value of VINI using the gate driver circuitry. FIG. 7 shows illustrative gate driver circuitry 20B with a plurality of gate integrated panels (GIPs). As shown, one way to provide reference voltage VINI to the pixels in active area 29 (AA) of display 14 is to have a single line 70. Reference voltage line 70 may be configured to supply a reference voltage VINI to display pixels in the active area of the display via lines 74. In order to enable dynamic VINI control and reduce leakage in transistors T4 and T7, gate driver circuitry of the type shown in FIG. 8 may be used.

Figure 8:
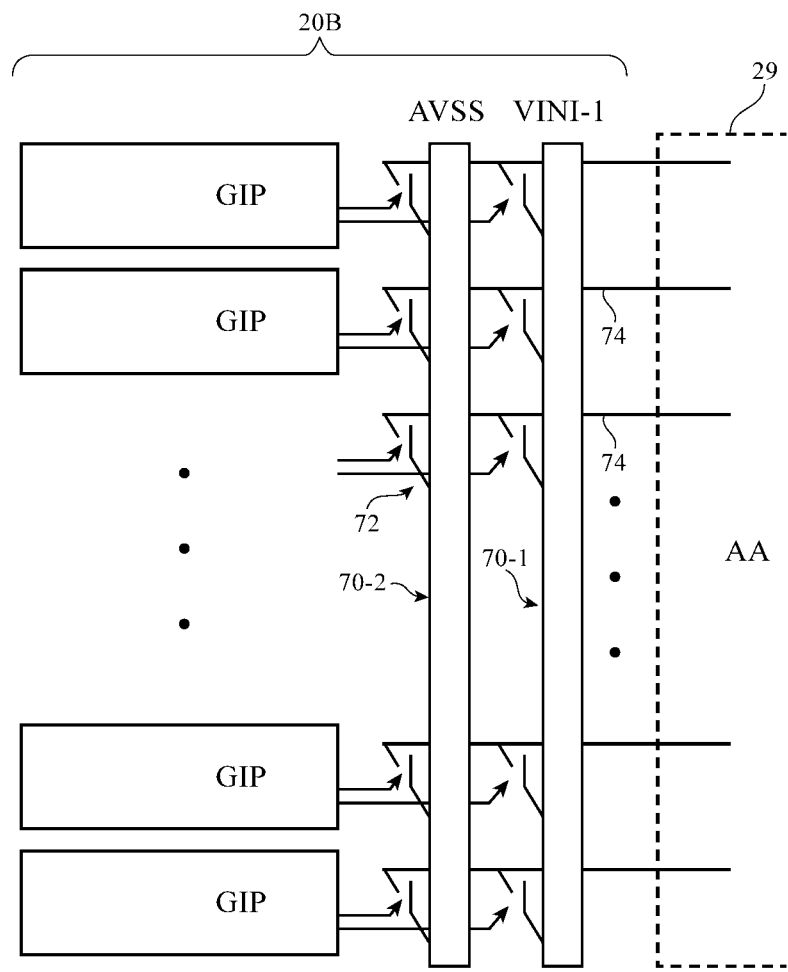
FIG. 8 is a schematic diagram of illustrative gate driver circuitry for a display with dynamic reference voltage lines in accordance with an embodiment.

As shown in FIG. 8, two reference voltage lines 70-1 and 70-2 may be provided. The reference voltage lines may have switches 72 coupled to each line 74. In this way the gate-integrated panels (GIPs) can provide two reference voltages (VINI-1 on line 70-1 and AVSS on line 70-2). The switches can then be controlled to determine which reference voltage will actually be coupled to line 74 and supplied to the pixel. Thus, even though there is only a single VINI input per pixel in the active area, the VINI value can be switched between VINI-1 and AVSS. This allows for control of leakage in transistors T4 and T7. Switches 72 may be implemented using thin-film transistors or other desired methods.

Figure 9:
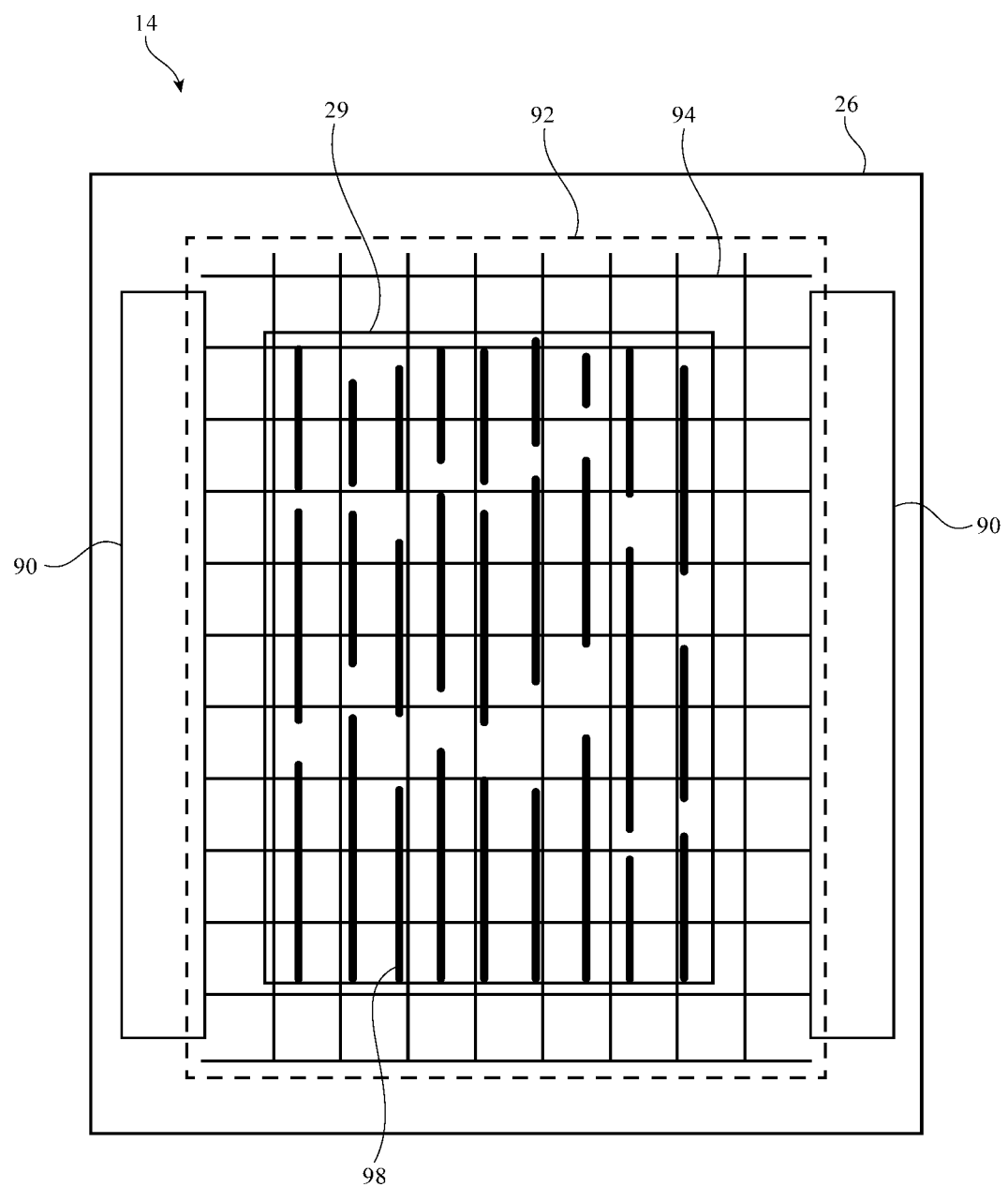
FIG. 9 is a top view of an illustrative display with a conductive mesh shorted to the ground power supply terminal in accordance with an embodiment.

As previously discussed, transistor leakage can become particularly prevalent if the ground power supply terminal (ELVSS) has to be lowered to enable increased luminance in the display. One way to help avoid this problem is to therefore enable increased luminance through methods aside from lowering the ground voltage level. An example of this is shown in FIG. 9. As shown, ELVSS (sometimes referred to as the cathode) may be formed from metal layers 90 which are positioned on opposing sides of active area 29. The metal layers 90 may be shorted to a thin conductive layer 92 that overlaps the active area. In some cases, conductive layer 92 may be positioned over the display pixels such that conductive layer 92 needs to be transparent (in order to not obscure the displayed image). Accordingly, in some embodiments, conductive layer 92 may be formed from a transparent conductive material (e.g., indium tin oxide). Conductive layer 92 may have any desired thickness (e.g., greater than 100 microns, less than 100 microns, less than 10 microns, less than 1 micron, less than 1000 Å, less than 100 Å, less than 50 Å, etc.).

Conductive layer 92 may experience a large voltage drop due to the large currents it is exposed to and the (relatively) high resistance of the conductive sheet. In order to reduce the resistance of the cathode, a conductive mesh 94 may be shorted to conductive sheet 92. Conductive mesh 94 may lower the resistance of the cathode, therefore reducing the voltage drop across the cathode, thereby enabling a higher light-emitting diode luminance without reduction of the ground voltage value. The conductive mesh may be formed from any desired material (e.g., silver nanowire) and may have any desired thickness. The positive power supply terminal (ELVDD) 98 is also shown in FIG. 9.

Figure 10:
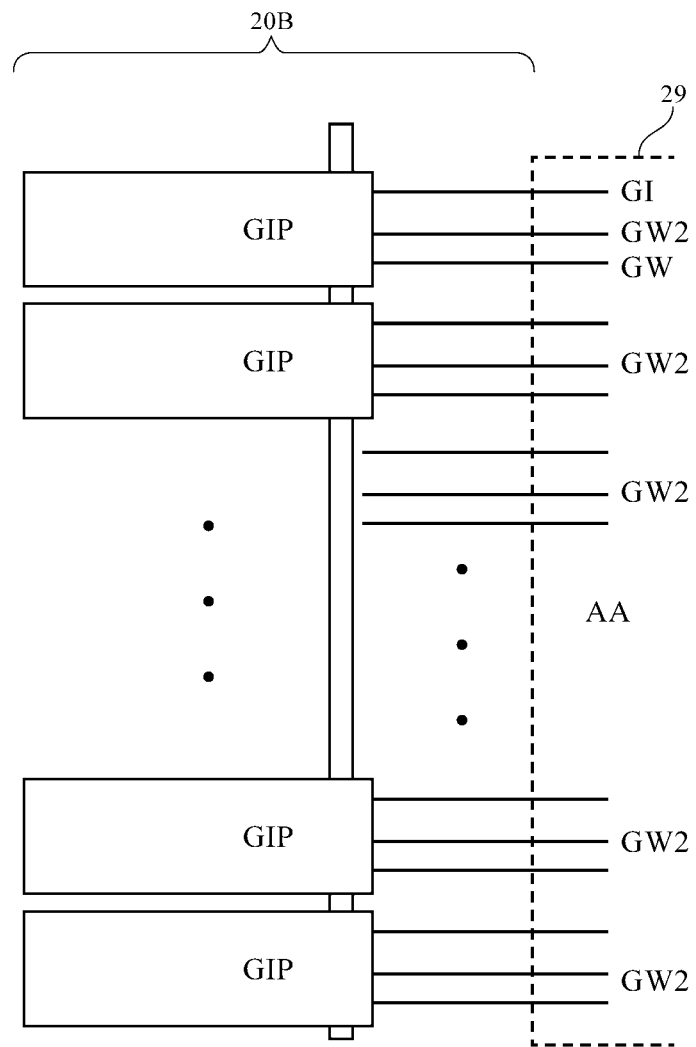
FIG. 10 is a schematic diagram of illustrative gate driver circuitry for a display with multiple scan lines for per-transistor leakage control in accordance with an embodiment.

Finally, a schematic diagram of illustrative gate driver circuitry for a display with multiple scan lines for per-transistor leakage control is shown in FIG. 10. FIG. 4 described how independent control of reference voltages (VINI-1 and AVSS) for respective transistors may reduce transistor leakage. Similarly, switching transistor control signals GW and GI may be split into multiple different switching transistor control signals for per-transistor leakage control. An example of this is shown in FIG. 10 where there are three separate control signals (GW, GW2, and GI) instead of two as shown in FIGS. 3-6. Take as an example the control signal GW. In FIG. 3, the same control signal GW is applied to both T2 and T3. In FIG. 10, two GW control signals (GW and GW2) are provided instead of one. Control signal GW may be coupled to the gate terminal of T2 while control signal GW2 may be coupled to the gate terminal of T3 (as an example). This way, the off-biasing point of transistors T2 and T3 can be independently controlled, allowing for reduced leakage. Although not shown in FIG. 10, control signal GI could similarly split into a first signal that controls T4 and a second signal that controls T7.

In various embodiments, a display pixel may include a first power supply terminal, a second power supply terminal, an organic light-emitting diode, a first transistor that is a drive transistor, a second transistor that has a first-source drain terminal coupled to a data line and a second source-drain terminal coupled between the drive transistor and the organic light-emitting diode, a third transistor that has a first-source drain terminal coupled between the drive transistor and the first power supply terminal. The drive transistor may supply a current to the organic light-emitting diode, and the drive transistor and the organic light-emitting diode may be coupled in series between the first and second power supply terminals.

The drive transistor, the second transistor, and the third transistor may be asserted to load data onto a storage capacitor. The first power supply terminal may be a positive power supply terminal, and the second power supply terminal may be a ground power supply terminal. The organic light-emitting diode may be coupled to the ground power supply terminal. The display pixel may also include a first enable transistor coupled between the organic light-emitting diode and the drive transistor and a second emission enable transistor coupled between the positive power supply terminal and the drive transistor. The display pixel may also include a reference voltage terminal coupled to the storage capacitor. The display pixel may also include a fourth transistor that is coupled between the reference voltage terminal and the storage capacitor.

The display pixel may also include a fifth transistor. The fifth transistor may have a first source-drain terminal that is coupled between the fourth transistor and the reference voltage terminal and a second source-drain terminal that is coupled between the first emission enable transistor and the organic light-emitting diode. The reference voltage terminal may be configured to provide a first reference voltage to the fourth transistor, and the reference voltage terminal may be configured to provide a second reference voltage that is different than the first reference voltage to the fifth transistor. The fifth transistor may have a first source-drain terminal that is coupled to an additional reference voltage terminal that is different than the reference voltage terminal, and the fifth transistor may have a second source-drain terminal that is coupled between the first emission enable transistor and the organic light-emitting diode.

In various embodiments, a display pixel may include a first power supply terminal, a second power supply terminal, an organic light-emitting diode, a first transistor that is a drive transistor, a second transistor that has a first-source drain terminal coupled to a data line and a second source-drain terminal coupled between the drive transistor and the first power supply terminal, and a third transistor that has a first-source drain terminal coupled between the first and second transistor portions of the drive transistor. The drive transistor may supply a current to the organic light-emitting diode. The drive transistor and the organic light-emitting diode may be coupled in series between the first and second power supply terminals, and the drive transistor may be a dual gate transistor structure with first and second gates coupled to respective first and second transistor portions.

In various embodiments, an electronic device may include a display. The display may include a plurality of display pixels. Each display pixel may include a first power supply terminal, a second power supply terminal, an organic light-emitting diode, a first transistor that is a drive transistor that supplies a current to the organic light-emitting diode, a first reference voltage terminal that is configured to supply a first reference voltage to a second transistor, and a second reference voltage terminal that is configured to supply a second reference voltage that is different than the first reference voltage to a third transistor. The display may also include a conductive layer that forms the second power supply terminal and a conductive mesh that is shorted to the conductive layer.

Figure 11:
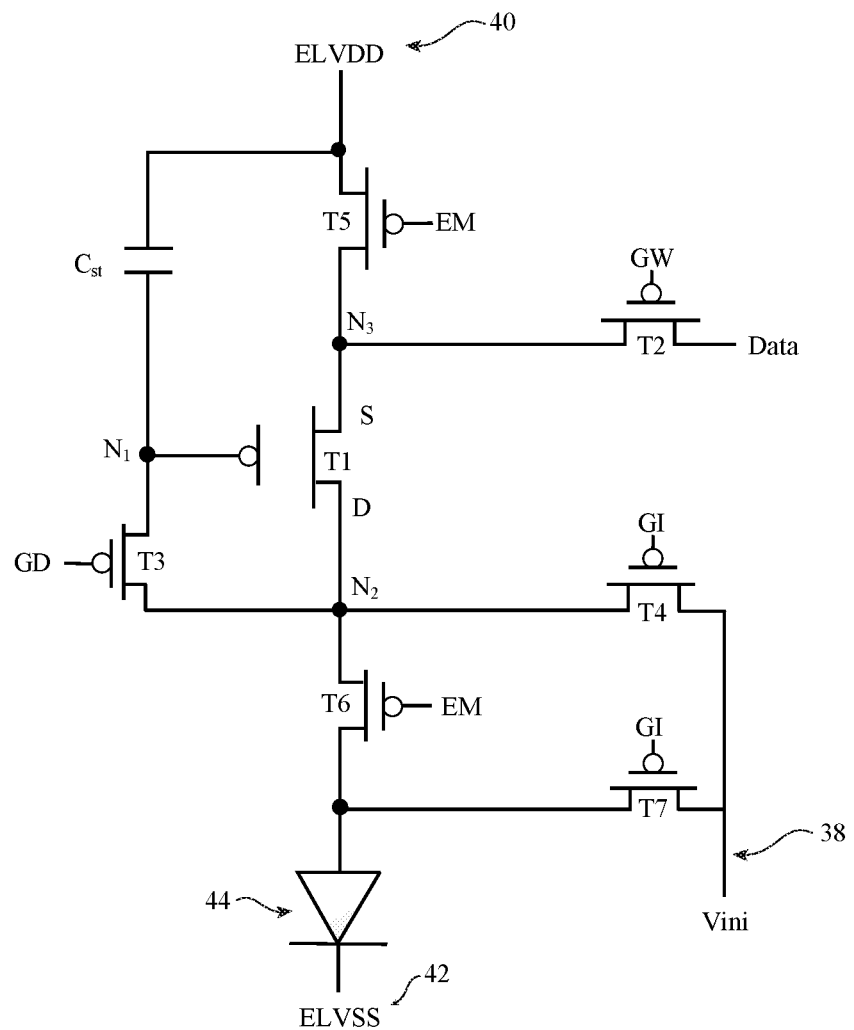
FIG. 11 is a diagram of an illustrative pixel circuit with T4 moved to reduce leakage in accordance with an embodiment.

FIG. 11 shows an illustrative pixel circuit with yet another arrangement to reduce thin-film transistor leakage. As a reminder, in the pixel circuit of FIG. 3, the voltage drop across transistor T4 may result in undesirable leakage. In FIG. 11, this is avoided by moving T4 adjacent to node N2. In FIG. 3, T4 is coupled between VINI and node N1, allowing leakage between node N1 and VINI. However, in FIG. 11 T4 is coupled between node N2 and VINI. The arrangement of FIG. 11 therefore prevents leakage form N1 across T4 (as was possible in the arrangement of FIG. 3).

The pixel in FIG. 11 may otherwise be similar to the pixels of FIGS. 3-6. As shown in FIG. 11, pixel circuit 22 includes light-emitting diode 44 (e.g., an organic light-emitting diode, a crystalline micro-light-emitting diode die, etc.). Light-emitting diode 44 may emit light in proportion to the amount of current that is driven through light-emitting diode 44 by transistor T1. Transistor T5, Transistor T1, Transistor T6, and light-emitting diode 44 may be coupled in series between respective power supply terminals (see, e.g., positive power supply terminal 40 (ELVDD) and ground power supply terminal 42 (ELVSS)). Transistor T1 may have a source terminal (S) coupled to positive power supply terminal 40, a drain terminal (D) coupled to node N2, and a gate terminal coupled to node N1. The terms "source" and "drain" terminals of a transistor can sometimes be used interchangeably and may therefore be referred to herein as "source-drain" terminals. The voltage on node N1 at the gate of transistor T1 controls the amount of current that is produced by transistor T1. This current is driven through light-emitting diode 44, so transistor T1 may sometimes be referred to as a drive transistor.

Transistors T5 and T6 can be turned off to interrupt current flow between transistor T1 and diode 44 and may be turned on to enable current flow between transistor T1 and diode 44. Emission enable control signal EM is applied to the gates of transistors T5 and T6. During operation, transistors T5 and T6 are controlled by emission enable control signal EM and are sometimes referred to as emission transistors or emission enable transistors. Control signals GW, GD, and GI, which may sometimes be referred to as switching transistor control signals, are applied to the gates of switching transistors T2, T3, T4, and T7 and control the operation of transistors T2, T3, T4, and T7. In particular, control signal GW is used to control transistor T2, control signal GD is used to control transistor T3, and control signal GI is used to control transistors T4 and T7. The capacitor Cst of pixel circuit 22 may be used for data storage. Pixel 22 may also include reference voltage terminal 38 (VINI). Reference voltage terminal 38 may be used to supply a reference voltage (e.g., VINI may be approximately −3.4 Volts or any other desired voltage).

It should be noted that in FIG. 3, transistors T2 and T3 are controlled using the same control signal (GW), whereas in FIG. 11, transistors T2 and T3 are controlled using different control signals (GW and GD). This example is merely illustrative, and each transistor may be controlled using any desired control signal.

Additionally, in connection with FIG. 4 it was noted that reference voltage terminal VINI could be split into two reference voltage terminals 38-1 and 38-2 (VINI-1 and AVSS). Using two reference voltage terminals 38-1 and 38-2 allows for independent control of leakage through transistors T4 and T7 which may reduce leakage in the transistors. The pixel shown in FIG. 11 may also include two reference terminals 38-1 and 38-2 for independent control of leakage through transistors T4 and T7 if desired.

Figure 12:
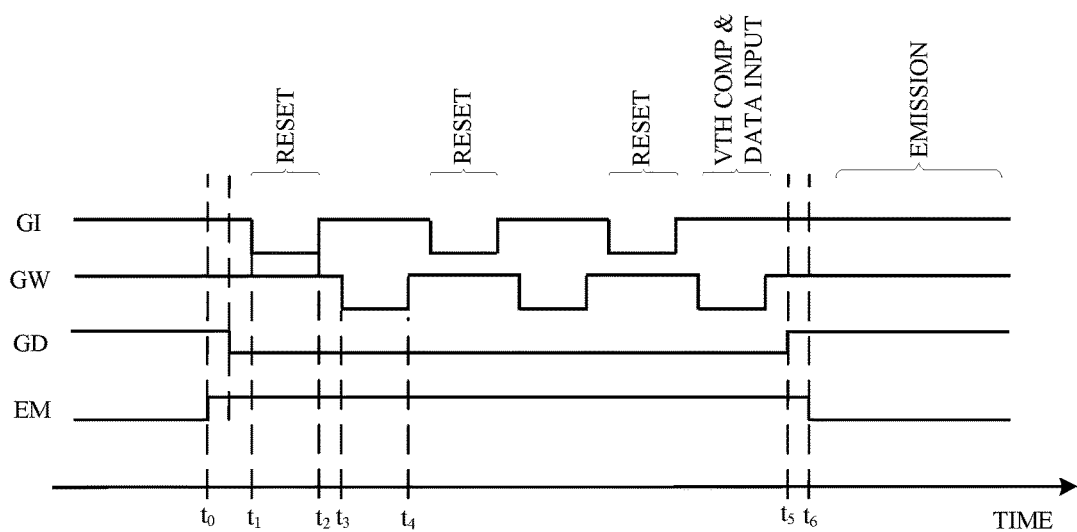
FIG. 12 is an illustrative timing diagram showing operation of the pixel circuit of FIG. 11 in accordance with an embodiment.
Figure 13:
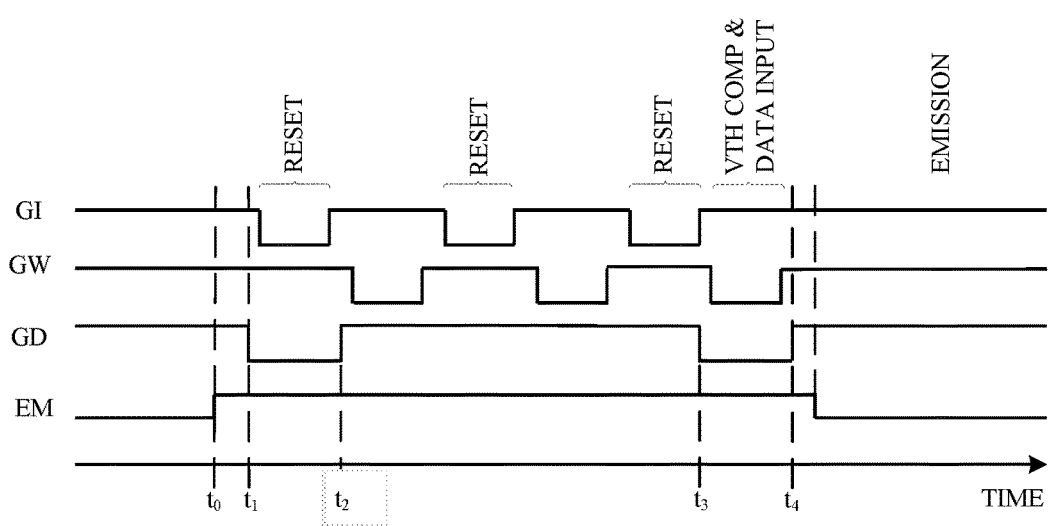
FIG. 13 is an illustrative timing diagram showing an alternate method of operating the pixel circuit of FIG. 11 in accordance with an embodiment.

FIGS. 12 and 13 show illustrative timing diagrams for operating the pixel of FIG. 11. As shown in FIG. 12, at to the previous frame may end and the emission control signal may be raised high (turning off emission transistors T5 and T6 and preventing the emission of light). During a reset period between $t_1$ and $t_2$, control signal GI may be low (turning on transistors T4 and T7), control signal GW may be high (turning off transistor T2), and control signal GD may be low (turning on transistor T3). Control signal GD may remain low until $t_5$. After $t_5$ at $t_6$, the emission control signal EM may be lowered, turning on emission transistors T5 and T6 and allowing light to be emitted from light-emitting diode 44. In between reset periods, control signal GI may be raised high (turning off transistors T4 and T7) and control signal GW may be lowered (turning on transistor T2).

In FIG. 13, the timing diagram is the same as the timing diagram of FIG. 12 for control signals GI, GW and EM. FIG. 13 has an alternate timing for control signal GD. In FIG. 13, control signal GD is lowered at $t_1$ (similar to as in FIG. 12). However, in FIG. 13, GD may then be raised at $t_2$ and kept high until $t_3$. GD may be lowered between $t_3$ and $t_4$ before ultimately being kept high during the emission period.

In general, the pixel circuit of FIG. 11 may be operated using any desired control signal timings. The pixel of FIG. 11 may employ any desired threshold voltage compensation techniques to compensate for threshold voltage variation in drive transistor T1.

In various embodiments, a display pixel may include a first power supply terminal, a second power supply terminal, a light-emitting diode, and a first transistor. The first transistor may be a drive transistor that supplies a current to the light-emitting diode, the drive transistor and the light-emitting diode may be coupled in series between the first and second power supply terminals, and the first transistor may have a gate coupled to a first node, a first source-drain terminal coupled to a second node, and a second source-drain terminal coupled to a third node. The display pixel may also include a second transistor that has a first source-drain terminal coupled to the first node and a second source-drain terminal coupled to the second node. The second node may be interposed between the drive transistor and the light-emitting diode. The display pixel may also include a third transistor that has a first source-drain terminal coupled to the second node and a second source-drain terminal coupled to a reference voltage terminal.

The display pixel may also include a storage capacitor coupled between the first node and the first power supply terminal and a fourth transistor that has a first source-drain terminal coupled to the third node and a second source-drain terminal coupled to a data line. The third node may be interposed between the first transistor and the first power supply terminal. The display pixel may include a fifth transistor and a sixth transistor. The fifth transistor may be interposed between the third node and the first power supply terminal and the sixth transistor may be interposed between the second node and the light-emitting diode. The display pixel may also include a seventh transistor that has a first source-drain terminal coupled between the sixth transistor and the light-emitting diode and a second source-drain terminal coupled to the reference voltage terminal. The display pixel may also include a seventh transistor that has a first source-drain terminal coupled between the sixth transistor and the light-emitting diode and a second source-drain terminal coupled to an additional reference voltage terminal. A gate of the second transistor may be coupled to a first control signal and a gate of the fourth transistor may be coupled to a second control signal that is different than the first control signal. The fifth and sixth transistors may be emission enable transistors. The second, third, and fourth transistors may be switching transistors.

In various embodiments, a display pixel may include a first power supply terminal, a second power supply terminal, a light-emitting diode, and a first transistor. The first transistor may be a drive transistor that supplies a current to the light-emitting diode, the drive transistor and the light-emitting diode may be coupled in series between the first and second power supply terminals, and a gate of the first transistor may be coupled to a first node. The display pixel may also include a second transistor that has a first source drain terminal coupled to a data line and a second source-drain terminal coupled between the drive transistor and the first power supply terminal, a third transistor that has a first source-drain terminal coupled to the first node and a second source-drain terminal coupled between the first transistor and the light-emitting diode, and a fourth transistor that has a first source-drain terminal coupled between the first transistor and the light-emitting diode and a second source-drain terminal coupled to a reference voltage terminal.

The display pixel may also include a storage capacitor coupled between the first node and the first power supply terminal. The display pixel may also include a fifth transistor and a sixth transistor. The fifth transistor may be interposed between the first transistor and the first power supply terminal and the sixth transistor may be interposed between the first transistor and the light-emitting diode. The display pixel may also include a seventh transistor that has a first source-drain terminal coupled between the sixth transistor and the light-emitting diode and a second source-drain terminal coupled to the reference voltage terminal. A gate of the second transistor may be coupled to a first control signal and a gate of the third transistor may be coupled to a second control signal that is different than the first control signal. A gate of the fourth transistor may be coupled to a third control signal and a gate of the seventh transistor may also be coupled to the third control signal. A gate of the fifth transistor may be coupled to a fourth control signal and a gate of the sixth transistor may also be coupled to the fourth control signal.

In various embodiments, a display pixel may include a first power supply terminal, a second power supply terminal, a light-emitting diode, and a first transistor. The first transistor may be a drive transistor that supplies a current to the light-emitting diode, the drive transistor and the light-emitting diode may be coupled in series between the first and second power supply terminals, and the first transistor may have a gate coupled to a first node, a first source-drain terminal coupled to a second node, and a second source-drain terminal coupled to a third node. The display pixel may also include a second transistor that has a first source drain terminal coupled to a data line and a second source-drain terminal coupled to the third node. The third node may be interposed between the drive transistor and the first power supply terminal. The display pixel may also include a storage capacitor coupled between the first node and the first power supply terminal and a third transistor that has a first source-drain terminal coupled to the second node and a second source-drain terminal coupled to a reference voltage terminal. The second node may be interposed between the drive transistor and the light-emitting diode.

The display pixel may also include a fourth transistor that has a first source-drain terminal coupled to the first node and a second source-drain terminal coupled to the second node. The display may also include a fifth transistor that has a first source-drain terminal coupled between the second node and the light-emitting diode and a second source-drain terminal coupled to the reference voltage terminal. The display pixel may also include a first emission enable transistor interposed between the second node and the light-emitting diode and a second emission enable transistor interposed between the third node and the first power supply terminal.

The foregoing is merely illustrative and various modifications can be made by those skilled in the art without departing from the scope and spirit of the described embodiments. The foregoing embodiments may be implemented individually or in any combination.

What is claimed is:
1. A display pixel, comprising:
a first power supply terminal;
a second power supply terminal;
a light-emitting diode;
a first transistor, wherein the first transistor is a drive transistor that supplies a current to the light-emitting diode, wherein the drive transistor and the light-emit- ting diode are coupled in series between the first and second power supply terminals, wherein the first transistor has a gate coupled to a first node, a first source-drain terminal coupled to a second node, and a second source-drain terminal coupled to a third node;

a second transistor that has a first source-drain terminal coupled to the first node and a second source-drain terminal coupled to the second node, wherein the second node is interposed between the drive transistor and the light-emitting diode; and a third transistor that has a first source-drain terminal coupled to the second node and a second source-drain terminal coupled to a reference voltage terminal.

2. The display pixel defined in claim 1, further comprising a storage capacitor coupled between the first node and the first power supply terminal.

3. The display pixel defined in claim 2, further comprising:
a fourth transistor that has a first source-drain terminal coupled to the third node and a second source-drain terminal coupled to a data line, wherein the third node is interposed between the first transistor and the first power supply terminal.

4. The display pixel defined in claim 3, further comprising:
a fifth transistor, wherein the fifth transistor is interposed between the third node and the first power supply terminal; and
a sixth transistor, wherein the sixth transistor is interposed between the second node and the light-emitting diode.

5. The display pixel defined in claim 4, further comprising:
a seventh transistor that has a first source-drain terminal coupled between the sixth transistor and the light-emitting diode and a second source-drain terminal coupled to the reference voltage terminal.

6. The display pixel defined in claim 4, further comprising:
a seventh transistor that has a first source-drain terminal coupled between the sixth transistor and the light-emitting diode and a second source-drain terminal coupled to an additional reference voltage terminal.

7. The display pixel defined in claim 4, wherein a gate of the second transistor is coupled to a first control signal and wherein a gate of the fourth transistor is coupled to a second control signal that is different than the first control signal.

8. The display pixel defined in claim 4, wherein the fifth and sixth transistors are emission enable transistors.

9. The display pixel defined in claim 4, wherein the second, third, and fourth transistors are switching transistors.

10. The display pixel defined in claim 1, further comprising:
a fourth transistor that has a first source-drain terminal coupled between the first transistor and the light-emitting diode and a second source-drain terminal coupled to the reference voltage terminal.

11. The display pixel defined in claim 1, further comprising:
a fourth transistor that has a first source-drain terminal coupled to a data line and a second source-drain terminal coupled to the third node, wherein the third node is interposed between the drive transistor and the first power supply terminal.

12. A display pixel, comprising:
a first power supply terminal;
a second power supply terminal;
a light-emitting diode;
a first transistor, wherein the first transistor is a drive transistor that supplies a current to the light-emitting diode, wherein the drive transistor and the light-emitting diode are coupled in series between the first and second power supply terminals, and wherein a gate of the first transistor is coupled to a first node;
a second transistor that has a first source-drain terminal coupled to a data line and a second source-drain terminal coupled between the drive transistor and the first power supply terminal;
a third transistor that has a first source-drain terminal coupled to the first node and a second source-drain terminal coupled between the first transistor and the light-emitting diode; and
a fourth transistor that has a first source-drain terminal coupled between the first transistor and the light-emitting diode and a second source-drain terminal coupled to a reference voltage terminal.

13. The display pixel defined in claim 12, further comprising a storage capacitor coupled between the first node and the first power supply terminal.

14. The display pixel defined in claim 13, further comprising:
a fifth transistor, wherein the fifth transistor is interposed between the first transistor and the first power supply terminal; and
a sixth transistor, wherein the sixth transistor is interposed between the first transistor and the light-emitting diode.

15. The display pixel defined in claim 14, further comprising:
a seventh transistor that has a first source-drain terminal coupled between the sixth transistor and the light-emitting diode and a second source-drain terminal coupled to the reference voltage terminal.

16. The display pixel defined in claim 15, wherein a gate of the second transistor is coupled to a first control signal, and wherein a gate of the third transistor is coupled to a second control signal that is different than the first control signal.

17. The display pixel defined in claim 16, wherein a gate of the fourth transistor is coupled to a third control signal, wherein a gate of the seventh transistor is also coupled to the third control signal, wherein a gate of the fifth transistor is coupled to a fourth control signal, and wherein a gate of the sixth transistor is also coupled to the fourth control signal.

18. A display pixel, comprising:
a first power supply terminal;
a second power supply terminal;
a light-emitting diode;
a first transistor, wherein the first transistor is a drive transistor that supplies a current to the light-emitting diode, wherein the drive transistor and the light-emitting diode are coupled in series between the first and second power supply terminals, wherein the first transistor has a gate coupled to a first node, a first source-drain terminal coupled to a second node, and a second source-drain terminal coupled to a third node;
a second transistor that has a first source-drain terminal coupled to a data line and a second source-drain terminal coupled to the third node, wherein the third node is interposed between the drive transistor and the first power supply terminal;
a storage capacitor coupled between the first node and the first power supply terminal; and
a third transistor that has a first source-drain terminal coupled to the second node and a second source-drain terminal coupled to a reference voltage terminal, wherein the second node is interposed between the drive transistor and the light-emitting diode.

19. The display pixel defined in claim 18, further comprising:
a fourth transistor that has a first source-drain terminal coupled to the first node and a second source-drain terminal coupled to the second node.

20. The display pixel defined in claim 19, further comprising:
a fifth transistor that has a first source-drain terminal coupled between the second node and the light-emitting diode and a second source-drain terminal coupled to the reference voltage terminal;
a first emission enable transistor interposed between the second node and the light-emitting diode; and
a second emission enable transistor interposed between the third node and the first power supply terminal.

* * * * *